United States Patent
Chang

(10) Patent No.: US 8,004,627 B2
(45) Date of Patent: *Aug. 23, 2011

(54) THIN FILM TRANSISTOR SUBSTRATE

(75) Inventor: Jong-Woong Chang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 122 days.

This patent is subject to a terminal disclaimer.

(21) Appl. No.: 12/176,687

(22) Filed: Jul. 21, 2008

(65) Prior Publication Data

US 2008/0278648 A1 Nov. 13, 2008

Related U.S. Application Data

(63) Continuation of application No. 11/562,205, filed on Nov. 21, 2006, now Pat. No. 7,425,998, which is a continuation of application No. 10/934,179, filed on Sep. 3, 2004, now Pat. No. 7,158,195.

(30) Foreign Application Priority Data

Sep. 5, 2003 (KR) .................. 10-2003-0062203

(51) Int. Cl.
*G02F 1/1343* (2006.01)

(52) U.S. Cl. ............... 349/55; 257/59; 257/72

(58) Field of Classification Search ............ 257/59, 257/72; 349/40, 54, 55
See application file for complete search history.

(56) References Cited

U.S. PATENT DOCUMENTS

| | | | |
|---|---|---|---|
| 5,859,679 A * | 1/1999 | Song ............... | 349/54 |
| 5,995,178 A | 11/1999 | Fujikawa et al. | |
| 6,310,669 B1 | 10/2001 | Kobayashi et al. | |
| 6,333,769 B1 * | 12/2001 | Suzuki et al. ............ | 349/40 |
| 6,342,931 B2 * | 1/2002 | Nagata et al. ............ | 349/54 |
| 6,486,933 B1 | 11/2002 | Cha et al. | |
| 6,525,705 B1 | 2/2003 | Ishii et al. | |
| 6,639,634 B1 | 10/2003 | Zhang et al. | |
| 6,839,096 B1 | 1/2005 | Jeong et al. | |
| 6,839,118 B2 | 1/2005 | Nagaoka | |
| 6,888,589 B2 | 5/2005 | Kim et al. | |
| 2001/0028418 A1 * | 10/2001 | Ozaki et al. ............ | 349/54 |

FOREIGN PATENT DOCUMENTS

| | | | |
|---|---|---|---|
| JP | 10-010494 | * | 1/1998 |
| JP | 2003107528 | | 4/2003 |
| KR | 1020000006239 | | 1/2000 |
| KR | 1020010093702 | | 10/2001 |

* cited by examiner

*Primary Examiner* — Howard Weiss
(74) *Attorney, Agent, or Firm* — Cantor Colburn LLP

(57) ABSTRACT

A thin film transistor array panel comprises a plurality of gate lines formed on an insulating substrate; a repair line formed on the insulating substrate; a gate insulating layer formed on the gate lines and the repair line; a plurality of data lines formed on the gate insulating layer; an electricity dissipation line formed on the gate insulating layer crossing the gate lines and the repair line; and a first diode connecting the repair line and the electricity dissipation line. When static electricity is introduced through the repair lines, the static electricity is transferred to the electricity dissipation line and is dispersed or exhausted before it reaches to the data lines. As a result, the TFTs and wires in the display area are prevented from being destroyed by the static electricity.

11 Claims, 3 Drawing Sheets

THIN FILM TRANSISTOR SUBSTRATE

CROSS REFERENCE TO RELATED APPLICATIONS

This application is a continuation application of U.S. application Ser. No. 11/562,205, filed on Nov. 21, 2006 now U.S. Pat. No. 7,425,998, which is a continuation application of U.S. application Ser. No. 10/934,179, filed on Sep. 3, 2004 now U.S. Pat. No. 7,158,195 and claims priority to Korean Patent Application No. 10-2003-0062203 filed on Sep. 5, 2003, and all the benefits accruing therefrom under 35 U.S.C. §119, the contents of which in their entirety are herein incorporated by reference.

BACKGROUND OF THE INVENTION (a) Field of the Invention

The present invention relates to a thin film transistor array panel, and in detail, to a thin film transistor array panel having repair lines for repairing wire defects generated during a manufacturing process thereof.

(b) Description of the Related Art

A thin film transistor (TFT) array panel is used as a circuit panel for driving a pixel independently in a liquid crystal display (LCD) or an electro luminescence (EL) display. A TFT array panel comprises scanning signal lines (gate lines), image signal lines (data lines), TFTs connected to the gate and data lines, pixel electrodes connected to the TFTs, a gate insulating layer formed on the gate lines, and a passivation layer formed on the data lines and TFTs.

A TFT has a gate electrode which is a part of a gate line, a semiconductor layer forming a channel, a source electrode which is a part of a data line, and a drain electrode. A TFT is a switching device for transmitting or cutting off image signals which are transmitted through a data line according to scanning signals which are transmitted through a gate line.

In the TFT array panel, data lines, gate lines, and TFTs have fine sizes of micrometer dimensions, since they are formed in each pixel. Accordingly, there is much probability of occurring defects such as line shorts or discontinuities during the manufacturing process. Because of this, a repair structure such as a repair ring is formed on the TFT array panel. When a defect occurs, the repair ring is connected to the defected line through laser illumination, and appropriate portions of the defected line and the repair ring are cut off though laser illumination to repair the defect. Such a repair ring is formed to cross over gate lines or data lines with an insulating layer interposed therebetween. This structure allows the repair ring to be connected to gate lines or data lines through a shorting method such as a laser illumination.

In the meantime, the repair structure may cause other defects by introducing static electricity. That is, static electricity may be introduced into a TFT panel through the repair ring during the manufacturing process, it may be transferred to signal lines through insulation breakage, and it may burn TFTs of a display area.

SUMMARY OF THE INVENTION

The present invention suggests a TFT panel having the following structure.

A thin film transistor array panel comprises an insulating substrate; a plurality of first signal lines formed on the substrate; a plurality of second signal lines formed on the substrate and crossing the first signal lines in an insulating manner; a repair line formed around a display area that is defined by crossing of the first and the second signal lines; and an electricity dissipation line formed outside of the display area and crossing the repair line at a point before the repair line crosses the second signal lines.

The thin film transistor array panel may further comprise a first diode connecting the repair line and the electricity dissipation line. The first diode may have a polarity such that current flows from the repair line to the electricity dissipation line. The electricity dissipation line may cross the first signal lines, and further comprise a second diode connecting the electricity dissipation line and the first signal lines. The second diode may have a polarity such that current flows from the gate line to the electricity dissipation line. The thin film transistor array panel may further comprise a third diode having a polarity such that current flows from the electricity dissipation line to the first signal lines, and the others having a polarity such that current flows from the first signal lines to the electricity dissipation line.

A thin film transistor array panel comprises an insulating substrate; a plurality of gate lines formed on the insulating substrate, substantially extending in a transverse direction, and having an order from up to down; a repair line formed on the insulating substrate, substantially extending in a transverse direction, and disposed downside of the last gate line; a gate insulating layer formed on the gate lines and the repair line; a plurality of data lines formed on the gate insulating layer, substantially extending in a longitudinal direction, and having an order from left to right; an electricity dissipation line formed on the gate insulating layer, substantially extending in a longitudinal direction, disposed to the left side of the first data line, and crossing the gate lines and the repair line; a first diode having a first gate and drain electrodes connected to the repair line, a first source electrode connected to the electricity dissipation line, and a first semiconductor disposed on the first gate electrode and contacting the first source and drain electrodes.

The thin film transistor array panel may further comprise a passivation layer formed on the data lines and the electricity dissipation line, wherein the first drain electrode is formed on the same layer as the electricity dissipation line, and further comprises a first connector formed on the passivation layer and contacting the first drain electrode and the repair line through contact holes of the passivation layer. The thin film transistor array panel may further comprise a second diode having a second gate and drain electrode connected to the gate line, a second source electrode connected to the electricity dissipation line, and a second semiconductor disposed on the second gate electrode and contacting the second source and drain electrodes. The thin film transistor array panel may further comprise a third diode having a third gate and source electrodes connected to the electricity dissipation line, a third drain electrode connected to the gate line, and a third semiconductor disposed on the third gate electrode and contacting the third source and drain electrodes. The thin film transistor array panel may further comprise a passivation layer formed on the data lines and the electricity dissipation line, wherein the second and third drain electrodes are formed on the same layer as the electricity dissipation line, and further comprises a second connector formed on the passivation layer and contacting the second and third drain electrodes and the gate line through contact holes of the passivation layer, wherein a third connector is formed on the same layer as the gate line, and further comprises a third connector contacting the third gate electrode and the electricity dissipation line though contact holes of the passivation layer.

BRIEF DESCRIPTION OF THE DRAWINGS

The above and other advantages of the present invention will become more apparent by describing preferred embodiments thereof in detail with reference to the accompanying drawings in which.

DETAILED DESCRIPTION OF THE PREFERRED EMBODIMENTS

Figure 1:
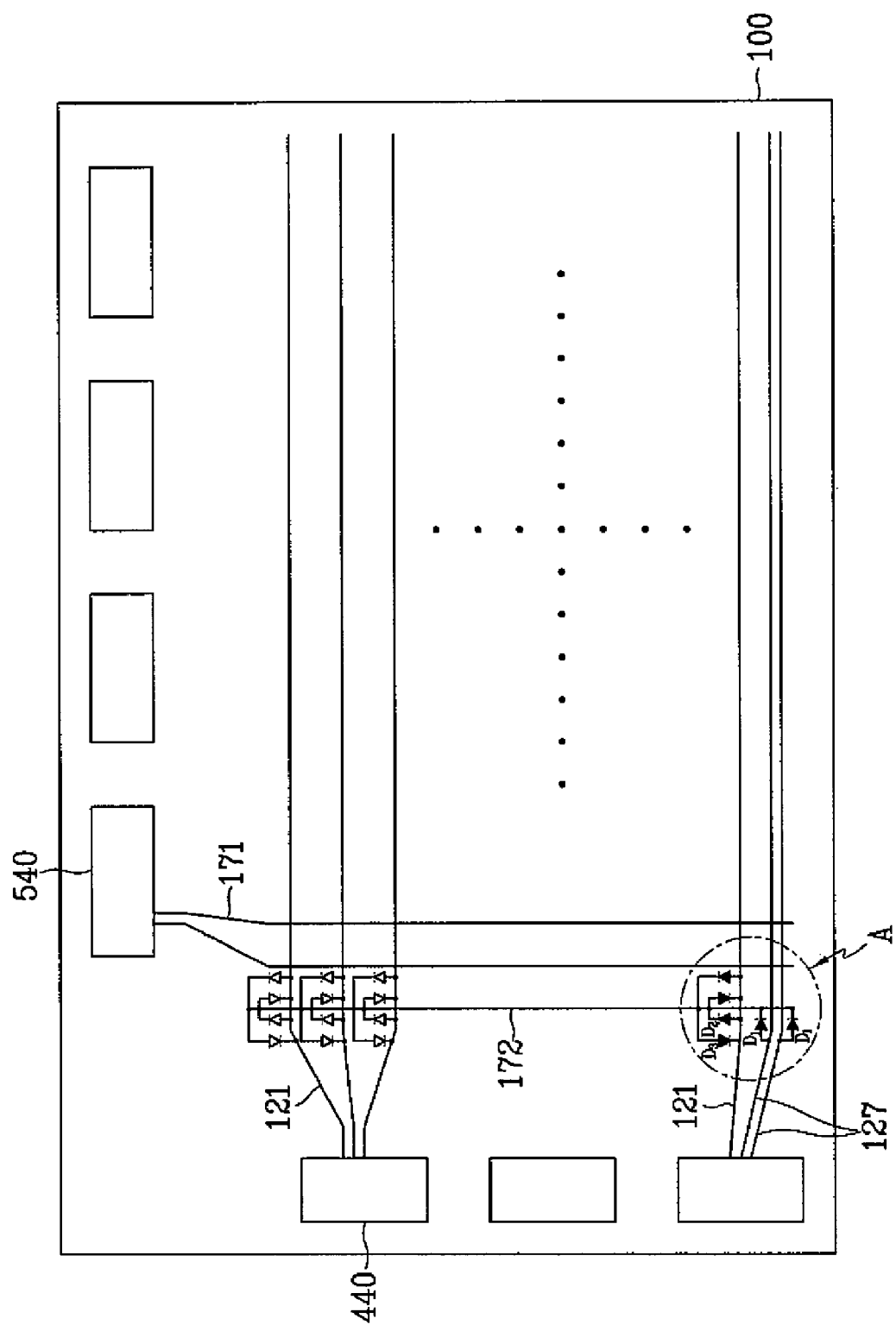
FIG. 1 is a layout view of a thin film transistor array panel according to an embodiment of the present invention.

The present invention will now be described more fully hereinafter with reference to the accompanying drawings, in which preferred embodiments of the invention are shown. The present invention may, however, be embodied in many different forms and should not be construed as being limited to the embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a thin film transistor (TFT) array panel according to an embodiment of the present invention will be described with reference to the accompanying drawings.

FIG. 1 is a layout view of a thin film transistor array panel according to an embodiment of the present invention.

A TFT array panel 100 according to an embodiment of the present invention includes an insulating substrate 110 (see FIGS. 3 to 5), a plurality of gate lines 121 and repair lines 127 extending substantially in a transverse direction, and a plurality of data lines 171 and an electricity dissipation line 172 extending substantially in a longitudinal direction.

A plurality of pixel areas are defined by crossing of the gate lines 121 and the data lines 171. The region where the pixel areas are formed is a display area. A TFT (not illustrated) and a pixel electrode (not illustrated) are formed in each pixel area.

The region around the display area is a circumference area. The circumference area has the electricity dissipation line 172, the repair lines 127, diodes D1, D2, and D3, gate driving circuits 440, and data driving circuits 540. Here, the gate driving circuits 440 and the data driving circuits 540 may have a form of integrated circuit chips or be directly formed on the TFT array panel.

The electricity dissipation line 172 disperses static electricity introduced by the gate lines 121 or the repair lines 127 to the wires of the entire substrate 110, to prevent the static electricity from destroying TFTs and wires of the display area. The static electricity may be dissipated to burn diodes D1, D2, and D3 during dispersion.

As shown in FIG. 1, the electricity dissipation line 172 crosses the repair lines 127 as well as the gate lines 121, and is connected with the gate lines 121 through four diodes D2 and D3. Here, two diodes D3 are provided for transmitting static electricity from the electricity dissipation line 172 to the gate lines 121 and the other two diodes D2 are provided for transmitting static electricity from the gate lines 121 to the electricity dissipation line 172. The electricity dissipation line 172 is also connected with the repair lines 127 through one diode D1. Here, the diode D1 is provided for transmitting static electricity from the repair lines 127 to the electricity dissipation line 172.

A diode of which connection polarity is opposite to that of the D1 may be connected between the repair lines 127 and the electricity dissipation line 172. The number of diodes D1, D2, and D3 may be increased. In such a situation, the disposition of diodes can be easily inferred from that of the diodes D2 and D3.

The structure of the TFT array panel according to the embodiment of the present invention will be described in detail.

Figure 2:
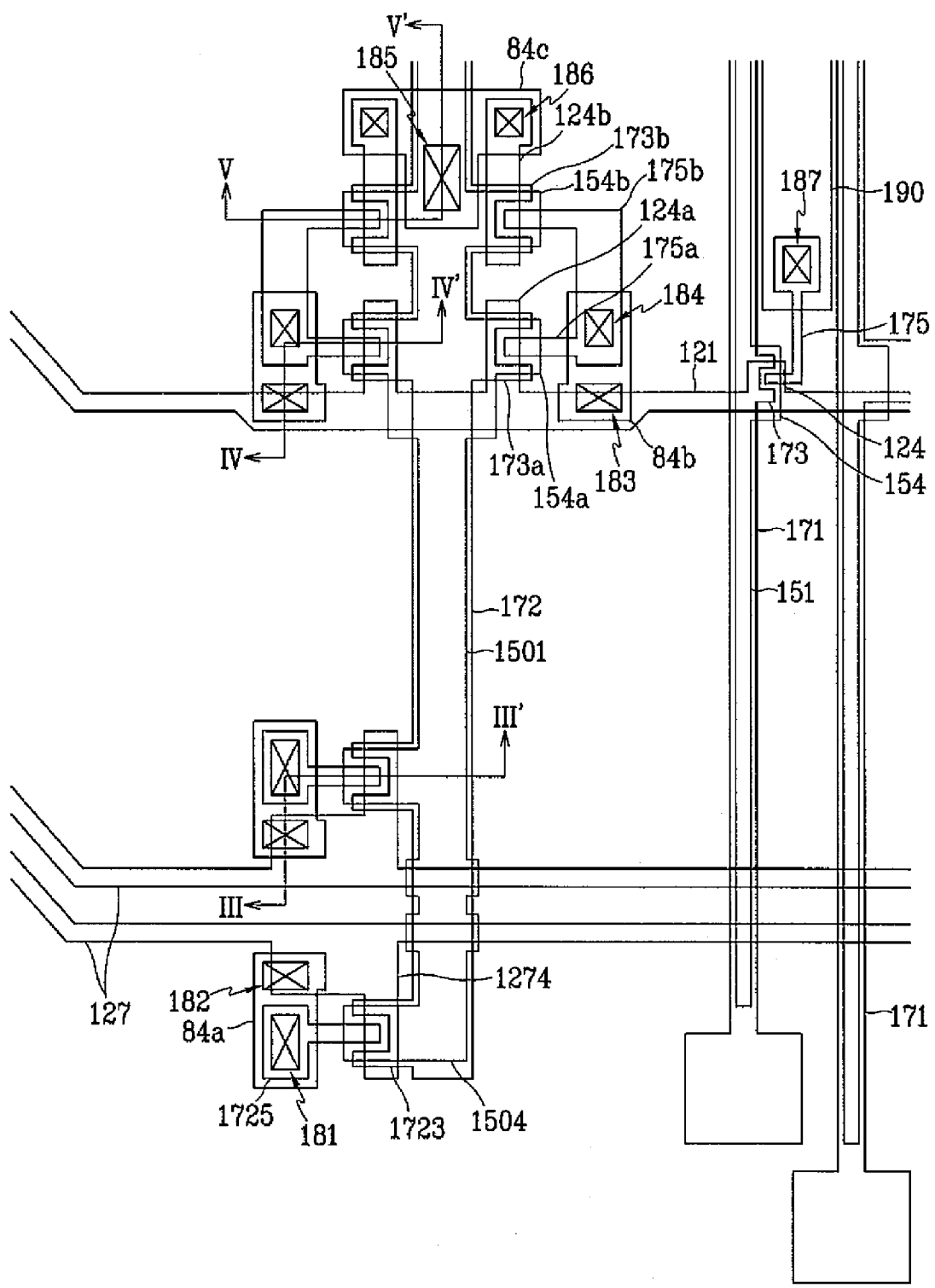
FIG. 2 is an enlarged view of region "A" in FIG. 1.
Figure 3:
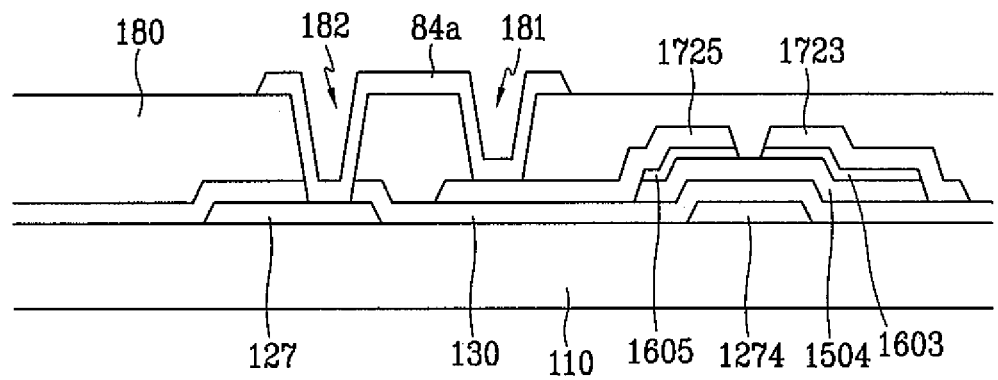
FIGS. 3 to 5 are sectional views of the TFT array panel shown in FIG. 3 taken along the lines III-III', IV-IV', and V-V', respectively.
Figure 4:
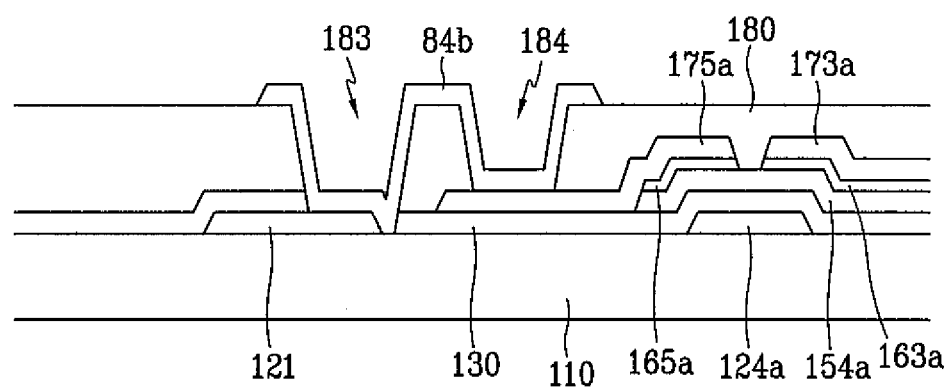
Figure 5:
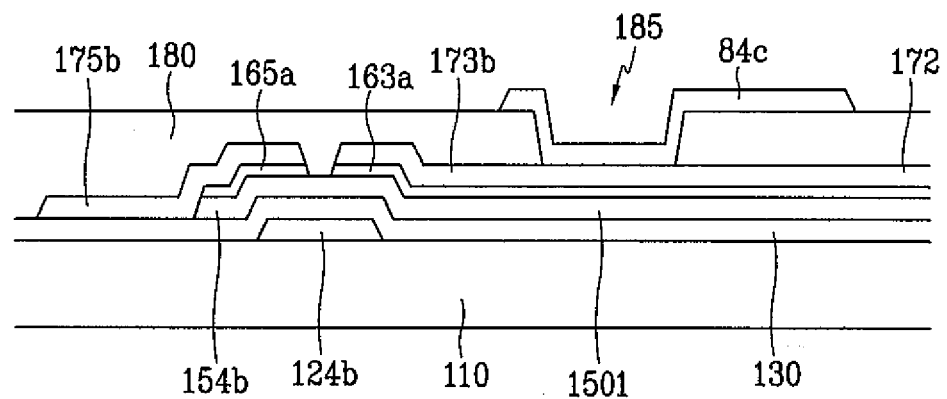

FIG. 2 is an enlarged view of region "A" in FIG. 1. FIGS. 3 to 5 are sectional views of the TFT array panel shown in FIG. 3 taken along the lines III-III', IV-IV', and V-V', respectively.

The repair lines 127 are formed on the insulating substrate 110. The repair lines 127 substantially extend in a transverse direction and cross the data lines 171 to allow laser shorting with the data lines 171 for repair. The repair lines 127 also cross the electricity dissipation line 172. Each repair line 127 is connected to a first gate electrode 1274 which is employed for forming a first diode.

The gate lines 121 are formed on the insulating substrate 110. The gate lines 127 substantially extend in a transverse direction. The gate lines 121 cross the data lines 171 to define pixel areas and have a plurality of gate electrodes 124 which are a part of a TFT formed in each of the pixel area.

The gate lines 121 also cross the electricity dissipation line 172 and have a pair of second gate electrodes 124a which are disposed on both sides of the electricity dissipation line 172, and are employed for forming a second diode.

A pair of third gate electrodes 124b are formed on the insulating substrate 110 and are employed for forming a third diode. The third gate electrodes 124b are connected with the electricity dissipation line 172 but are separated from the gate lines 121.

A gate insulating layer 140 is formed on the gate lines 121 and the repair lines 127.

A semiconductor layer 1504, 154a, 154b, 1501, 151, and 154 is formed on the gate insulating layer 140. The semiconductor layer 1504, 154a, 154b, 1501, 151, and 154 includes a semiconductor stripe 1501 formed under the electricity dissipation line 172, semiconductor islands 1504, 154a, and 154b respectively formed on the first to third gate electrodes 1274, 124a, and 124b, a plurality of semiconductor stripes 151 formed under the data lines 171, and a plurality of semiconductor islands 154 formed on the gate electrodes 124.

The data lines 171 and the electricity dissipation line 172 are formed on the semiconductor layer 1504, 154a, 154b, 1501, 151, and 154 and the gate insulating layer 140. The data lines 171 have a plurality of source electrodes 173. The electricity dissipation line 172 has first to third source electrodes 1723, 173a, and 173b.

A first to third drain electrodes 1725, 175a, and 175b which are separated from the electricity dissipation line 172 are formed on the gate insulating layer 140 and the semiconductor layer 1504, 154a, 154b, 1501, 151, and 154. The first to third drain electrodes 1725, 175a, and 175b are respectively extended to the semiconductor islands 1504, 154a, and 154b and respectively face the first to third source electrodes 1723, 173a, and 173b.

Here, the second drain electrode 175a and the third drain electrode 175b are connected to each other.

A plurality of drain electrodes 175 are formed on the semiconductor islands 154 and the gate insulating layer 140. The drain electrode 175 is a part of a TFT and is facing the source electrode 173 at the semiconductor island 154.

A passivation layer 180 is formed on the data lines 171 and the electricity dissipation line 172. The passivation layer 180 has first and second contact holes 181 and 182 which respectively expose the first drain electrodes 1725 and a portion of the gate electrodes 1274, third and forth contact holes 183 and 184 which respectively expose the gate line 121 and a portion of the second and third drain electrodes 175a and 175b, and fifth and sixth contact holes 185 and 186 which respectively expose the electricity dissipation line 172 and the third gate electrode 124b.

The passivation layer 180 also has a plurality of seventh contact holes 187 exposing the drain electrodes 175.

Connectors 84a, 84b, and 84c made of a transparent conductor such as indium tin oxide (ITO) or indium zinc oxide (IZO) are formed on the passivation layer 180.

The connectors 84a, 84b, and 84c include a first connector 84a connecting the first gate electrode 1274 and the first drain electrode 1724 through the first and the second contact holes 181 and 182, a second connector 84b connecting the gate line 121 and the second and third drain electrode 175a and 175b through the third and forth contact holes 183 and 184, and a third connector 84c connecting the electricity dissipation line 172 and the third gate electrode 124b through the fifth and sixth contact holes 185 and 186.

A plurality of pixel electrodes 190 made of a transparent conductor such as ITO or IZO are also formed on the passivation layer.

The connectors 84a, 84b, and 84c and the pixel electrodes 190 are formed of a transparent conductor in the present embodiment, but may be formed of a metal having good reflectivity such as aluminum (Al), in a reflective LCD. In such a case, the pixel electrodes 190 play a role of a mirror.

In the present embodiment, the first to third diodes respectively have a gate, a source, and a drain electrode to have a similar structure to a TFT. However, they can function as diodes since their gate electrodes are electrically connected with their source electrodes.

Now, in the present embodiment, a dispersion or consuming route of static electricity will be described with reference to FIG. 1.

First, when static electricity is introduced through one of the gate lines 121, the second diode D2 is turned on by the voltage of the static electricity and the static electricity is transferred to the electricity dissipation line 172.

The transferred static electricity flows through the electricity dissipation line 172 and is dispersed to the other gate lines through the third diodes D3 that are turned on by the voltage of the static electricity.

The static electricity may be exhausted to burn out the diodes D2 and D3 or the gate insulating layer 140 during dispersion through the second and third diodes D2 and D3 and the electricity dissipation line 172. At this time, the static electricity is converted into heat.

By the above-described mechanism, the TFTs and wires in the display area are prevented from being destroyed by the static electricity.

When static electricity is introduced through one of the repair lines 127, the first diode D1 is turned on and the static electricity is transferred to the electricity dissipation line 172.

In another way, a portion of the gate insulating layer 140 between the repair line 127 and the electricity dissipation line 172 may fail to short the repair line 127 and the electricity dissipation line 172, and the static electricity is transferred to the electricity dissipation line 172.

The transferred static electricity flows through the electricity dissipation line 172 and is dispersed to the other gate lines through the third diodes D3 that are turned on by the voltage of the static electricity.

The static electricity may be exhausted to burn out the diodes D1 and D3 or the gate insulating layer 140 during dispersion through the first and third diodes D1 and D3 and the electricity dissipation line 172. In this time, the static electricity is converted into heat.

By the above-described mechanism, the TFTs and wires in the display area are prevented from being destroyed by the static electricity.

As described above, since the repair lines 127 are connected with the electricity dissipation line 172 by the diodes D1 at points before the repair lines cross the data lines 171, static electricity introduced through the repair lines 127 is transferred to the electricity dissipation line 172 and is dispersed or exhausted before it reaches the data lines 171. As a result, the TFTs and wires in the display area are prevented from being destroyed by the static electricity.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel comprising:
an insulating substrate comprising a display area;
a first signal line disposed on the insulating substrate;
a second signal line crossing the first signal line, and insulated from the first signal line;
a repair line disposed outside the display area, and configured to allow laser shorting with the second signal line for repair;
an electricity dissipation line disposed outside the display area and crossing the first signal line and the repair line, respectively; and
a first diode connected directly to the repair line and the electricity dissipation line, and configured to have polarity such that current flows from the repair line to the electricity dissipation line.

2. The thin film transistor array panel of claim 1, wherein the first diode comprises:
first gate and drain electrodes electrically connected to the repair line, a first source electrode electrically connected to the electricity dissipation line, and a first semiconductor overlapping the first gate electrode and contacting the first source and drain electrodes.

3. The thin film transistor array panel of claim 2, further comprising a second diode connected to the first signal line and the electricity dissipation line, respectively, and configured to have polarity such that current flows from the first signal line to the electricity dissipation line.

4. The thin film transistor array panel of claim 3, further comprising a third diode connected to the first signal line and the electricity dissipation line, respectively, and configured to have polarity such that current flows from the electricity dissipation line to the first signal line.

5. The thin film transistor array panel of claim 1, further comprising:
a second diode connected directly to the repair line and the electricity dissipation line, and configured to have polarity such that current flows from the repair line to the electricity dissipation line.

6. A thin film transistor array panel comprising:
an insulating substrate comprising a display area;
a first signal line disposed on the insulating substrate;
a second signal line crossing the first signal line, and insulated from the first signal line;
a repair line disposed outside the display area, and configured to allow laser shorting with the second signal line for repair, the repair line being disposed on the same layer as the first signal line;
an electricity dissipation line disposed outside the display area and crossing the first signal line and the repair line, respectively, the electricity dissipation line disposed on the same layer as the second signal line; and
a first diode connected directly to the repair line and the electricity dissipation line, and configured to have polarity such that current flows from the repair line to the electricity dissipation line.

7. The thin film transistor array panel of claim 6, wherein the first diode comprises:
a first gate electrode disposed on the insulating substrate and electrically connected to the repair line;
a semiconductor layer insulated from the gate electrode and overlapping the gate electrode; and
first source and drain electrodes separated from each other and each contacting the semiconductor layer, the first drain electrode electrically connected to the repair line.

8. The thin film transistor array panel of claim 7, further comprising:
a first insulating layer covering the gate electrode and the repair line;
a second insulating layer covering the semiconductor layer and the first source and drain electrodes; and
a connector electrically connecting the repair line and the first drain electrode through contact holes formed in the first and second insulating layers.

9. The thin film transistor array panel of claim 7, further comprising a second diode connected to the first signal line and the electricity dissipation line, respectively, and configured to have polarity such that current flows from the first signal line to the electricity dissipation line.

10. The thin film transistor array panel of claim 9, further comprising a third diode connected to the first signal line and the electricity dissipation line, respectively, and configured to have polarity such that current flows from the electricity dissipation line to the first signal line.

11. The thin film transistor array panel of claim 10, further comprising a fourth diode connected directly to the repair line and the electricity dissipation line, and configured to have polarity such that current flows from the repair line to the electricity dissipation line.

* * * * *